United States Patent
Ueda et al.

(10) Patent No.: US 6,876,568 B2
(45) Date of Patent: Apr. 5, 2005

(54) TIMING ADJUSTING CIRCUIT AND SEMICONDUCTOR MEMORY DEVICE

(75) Inventors: Yutaka Ueda, Kawasaki (JP); Hiroshi Yoshioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/636,544

(22) Filed: Aug. 8, 2003

(65) Prior Publication Data

US 2004/0042300 A1 Mar. 4, 2004

(30) Foreign Application Priority Data

Aug. 28, 2002 (JP) ........................................ 2002-249240

(51) Int. Cl.$^7$ .............................................. G11C 11/22
(52) U.S. Cl. ...................................... 365/145; 365/191
(58) Field of Search ................................ 365/145, 191, 365/205, 207, 208, 233

(56) References Cited

U.S. PATENT DOCUMENTS 6,707,702 B1 * 3/2004 Komatsuzaki .............. 365/145

FOREIGN PATENT DOCUMENTS

JP          9-259590      * 10/1997   ........... G11C/14/00

* cited by examiner

*Primary Examiner*—Son Mai
(74) *Attorney, Agent, or Firm*—Arent Fox PLLC

(57) ABSTRACT

In a memory cell array, a plurality of memory cells having ferroelectric capacitors are arranged. A plurality of sense amplifier circuits amplifies the potential of the bit line of each memory cell. A column decoder outputs activation signals to activate the sense amplifier circuits. Timing adjusting circuits have a ferroelectric capacitor for timing adjustment in transmitting the activation signals output from the column decoder to the sense amplifier circuits.

20 Claims, 10 Drawing Sheets

F I G. 1
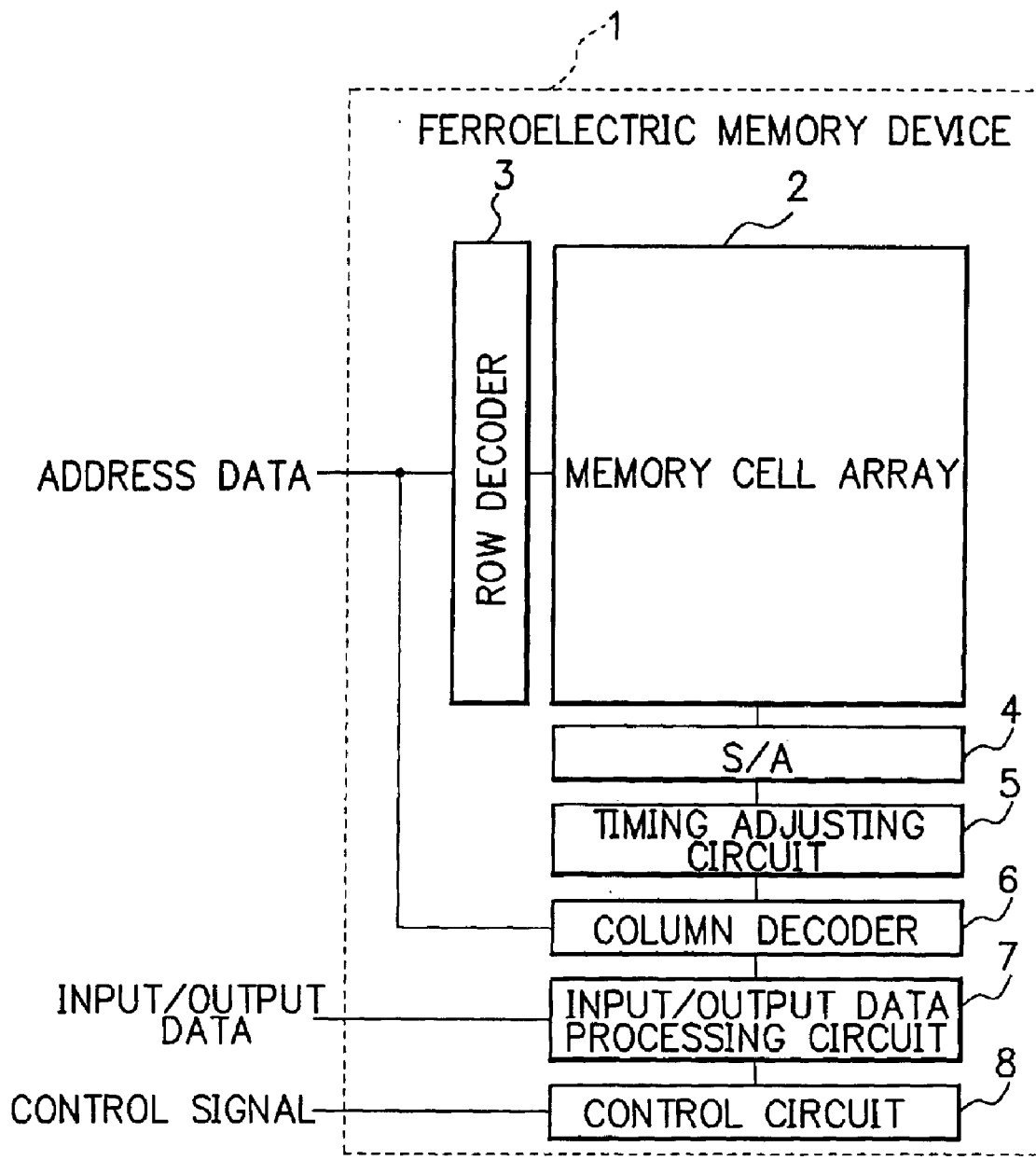

F I G. 2
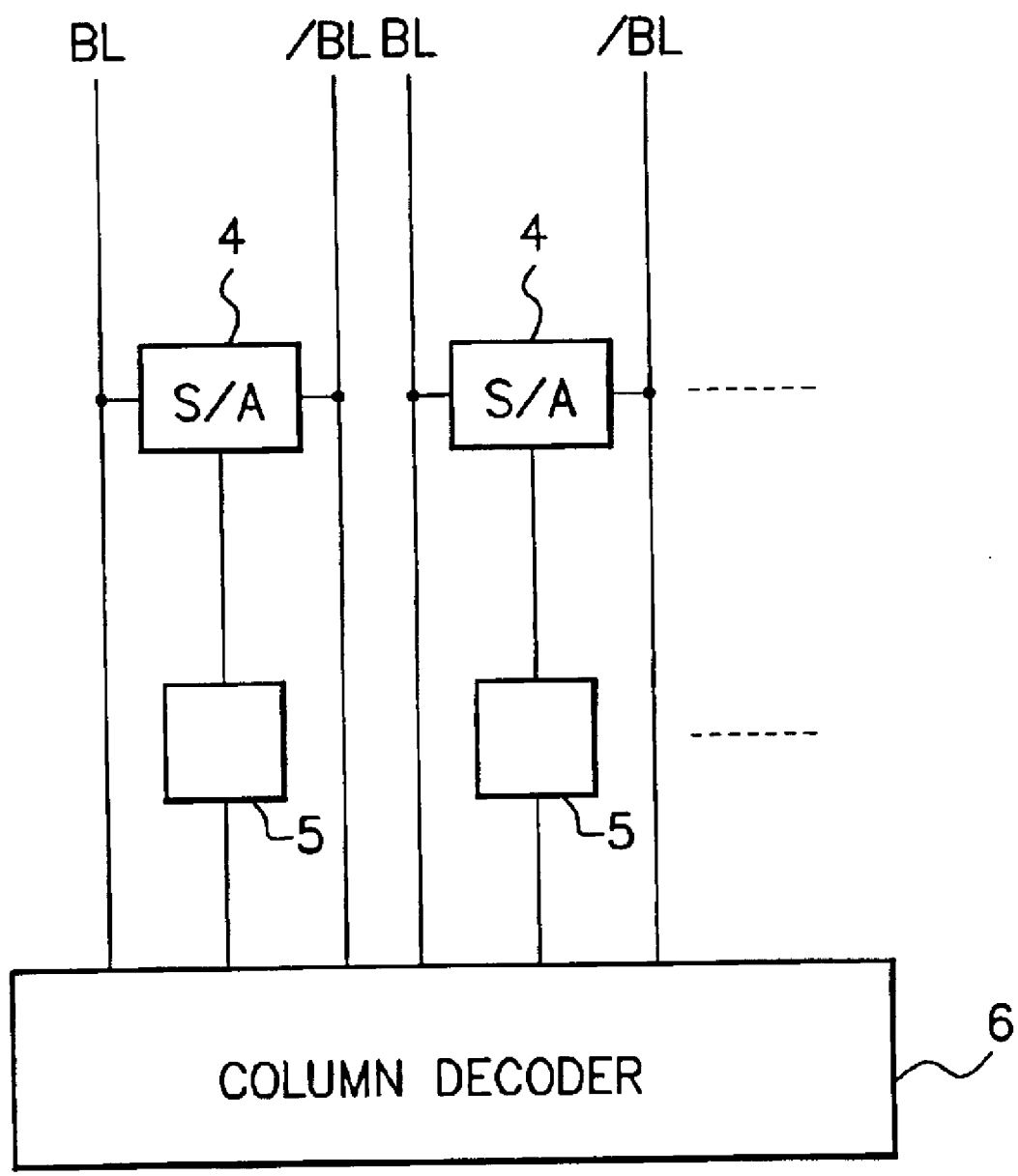

TIMING ADJUSTING CIRCUIT AND SEMICONDUCTOR MEMORY DEVICE

CROSS-REFERENCE TO RELATED APPLICATIONS

This application is based upon and claims the benefit of priority from the prior Japanese Patent Application No. 2002-249240, filed on Aug. 28, 2002, the entire contents of which are incorporated herein by reference.

BACKGROUND OF THE INVENTION

1. Field of the Invention

The present invention relates to a timing adjusting circuit and semiconductor memory device having a ferroelectric capacitor.

2. Description of the Related Art

A ferroelectric memory device is conventionally known as a semiconductor memory device which has memory cells using ferroelectric capacitors and stores data in accordance with the direction of polarization of the ferroelectric capacitors. The ferroelectric capacitor decreases the polarization amount (depolarization) by repeating polarization reversal. The hysteresis characteristic transition takes place from the curve indicated by the solid line in FIG. 8 to the curve indicated by the broken line. For example, when polarization reversal from Vcc=−V1 in FIG. 8 occurs, and Vcc=0 V transition (decrease) from a charge Q1 to a charge Q2 takes place. That is, the ferroelectric capacitor increases its capacitance during polarization reversal due to a change over time ($(Q3-Q1)/V1 < (Q3-Q2)/V1$ in FIG. 8).

The schematic arrangement of a conventional ferroelectric memory device having memory cells formed from ferroelectric capacitors will be described next.

FIG. 9 is a block diagram showing the schematic arrangement of a conventional ferroelectric memory device. Referring to FIG. 9, a ferroelectric memory device 101 has memory cells formed from ferroelectric capacitors and stores data in accordance with the direction of polarization of the ferroelectric capacitors. A row decoder 103 selects a word line on the basis of externally input address data. In a memory cell array 102, memory cells formed from ferroelectric capacitors (to be described below) are arranged in an array.

In accordance with data stored in the memory cells, a sense amplifier circuit (S/A circuit) 104 amplifies the potential of a bit line selected by a column decoder 105 (to be described later). The column decoder 105 selects a bit line on the basis of externally input address data. The column decoder 105 also outputs an activation signal that activates the sense amplifier circuit 104.

An input/output data processing circuit 106 latches or buffers input data to be stored in the memory cell array 102 or output data read out from the memory cell array 102, thereby inputting/outputting data from/to an external device through an input/output data bus. A control circuit 107 controls the operations of the above-described circuits on the basis of a control signal. With the above arrangement, the ferroelectric memory device 101 executes processing of writing/reading data in/from memory cells at portions designated by address data.

The schematic arrangement of a memory cell formed from ferroelectric capacitors will be described next. FIG. 10 is a view showing the schematic arrangement of a conventional memory cell formed from ferroelectric capacitors. Referring to FIG. 10, a memory cell M has ferroelectric capacitors C1 and C2 and transistors Tr1 and Tr2. One terminal of each of the ferroelectric capacitors C1 and C2 is connected to a corresponding one of bit lines BL and /BL through the transistor Tr1 or Tr2. The other terminal of each of the ferroelectric capacitors C1 and C2 is connected to a plate line PL. The bit lines BL and /BL are connected to the sense amplifier circuit 104. With this arrangement, when the sense amplifier circuit 104 is activated, it precharges the bit lines BL and /BL or amplifies the potential difference between the bit line BL and the bit line/BL. The gate terminals of the transistors Tr1 and Tr2 are connected to a word line WL. The transistors Tr1 and Tr2 are turned on/off by controlling the word line WL.

The influence of an increase in capacitances of the ferroelectric capacitors C1 and C2 due to a degradation over time shown in FIG. 8 in data read operation from the above-described memory cell M will be described with reference to an accompanying drawing. FIG. 11 is a timing chart showing the influence of an increase in capacitances of the ferroelectric capacitors C1 and C2 due to a degradation over time in data read operation from the above-described memory cell M shown in FIG. 10. As shown in FIG. 11, when the capacitances of the ferroelectric capacitors C1 and C2 increase, data output to the bit lines BL and /BL becomes slower, as indicated by broken lines in FIG. 11. To cope with this, the activation timing of the sense amplifier circuit 104 that amplifies the potential difference between the bit line BL and bit line/BL must be delayed from t1 to t2.

However, the progress of the above-described degradation in ferroelectric capacitors over time varies between the memory cells because it depends on the number of times of repetition of polarization reversal. For this reason, if the activation timing of the sense amplifier circuit is uniformly delayed, the data output timing is unnecessarily delayed.

Especially, when a plurality of sense amplifier circuits are used, it is difficult to appropriately adjust the activation timing of each sense amplifier circuit in accordance with a change over time.

Additionally, generally speaking, the above-described problem in the field of electric circuits, it is difficult to adjust the timing in accordance with a change in circuit element over time.

SUMMARY OF THE INVENTION

The present invention has been made in consideration of the above-described situation, and has as its object to provide a timing adjusting circuit and semiconductor memory device, which can adjust the activation timing of each sense amplifier circuit in accordance with a change over time in ferroelectric capacitor included in a memory cell.

It is another object of the present invention to provide a timing adjusting circuit capable of adjusting timing in accordance with the change in circuit element over time.

The present invention has been made to solve the above-described problems. A timing adjusting circuit according to the present invention is characterized by comprising a ferroelectric capacitor for timing adjustment in transmitting a signal. The method of adjusting a timing using a ferroelectric capacitor is general. When the ferroelectric capacitor is used, the timing can be adjusted in accordance with the elapse of time by using a change in capacitance over time, which is unique to the ferroelectric capacitor.

Hence, a timing adjusting circuit capable of adjusting a timing in accordance with a change in circuit element over time can be provided.

A semiconductor memory device according to the present invention is characterized by comprising memory cells formed from ferroelectric capacitors, sense amplifier circuits which precharge the potential of bit lines of the memory cells, and a timing adjusting circuit which uses a ferroelectric capacitor for timing adjustment in transmitting activation signals to activate the sense amplifier circuits.

Hence, the timing of the activation signals to activate the sense amplifier circuits can be adjusted in accordance with a change in capacitance of the ferroelectric capacitor of the memory cells over time.

BRIEF DESCRIPTION OF THE DRAWINGS

FIG. 1 is a block diagram showing the schematic arrangement of a ferroelectric memory device having a timing adjusting circuit according to an embodiment of the present invention;

FIG. 2 is a block diagram showing an example of peripheral circuits of the timing adjusting circuit 5 shown in FIG. 1;

DETAILED DESCRIPTION OF THE PREFERRED EMBODIMENTS

An embodiment of the present invention will be described below.

The schematic arrangement of a ferroelectric memory device (semiconductor memory device) having a timing adjusting circuit according to an embodiment of the present invention will be described first.

FIG. 1 is a block diagram showing the schematic arrangement of a ferroelectric memory device having a timing adjusting circuit according to an embodiment of the present invention.

Figure 10:
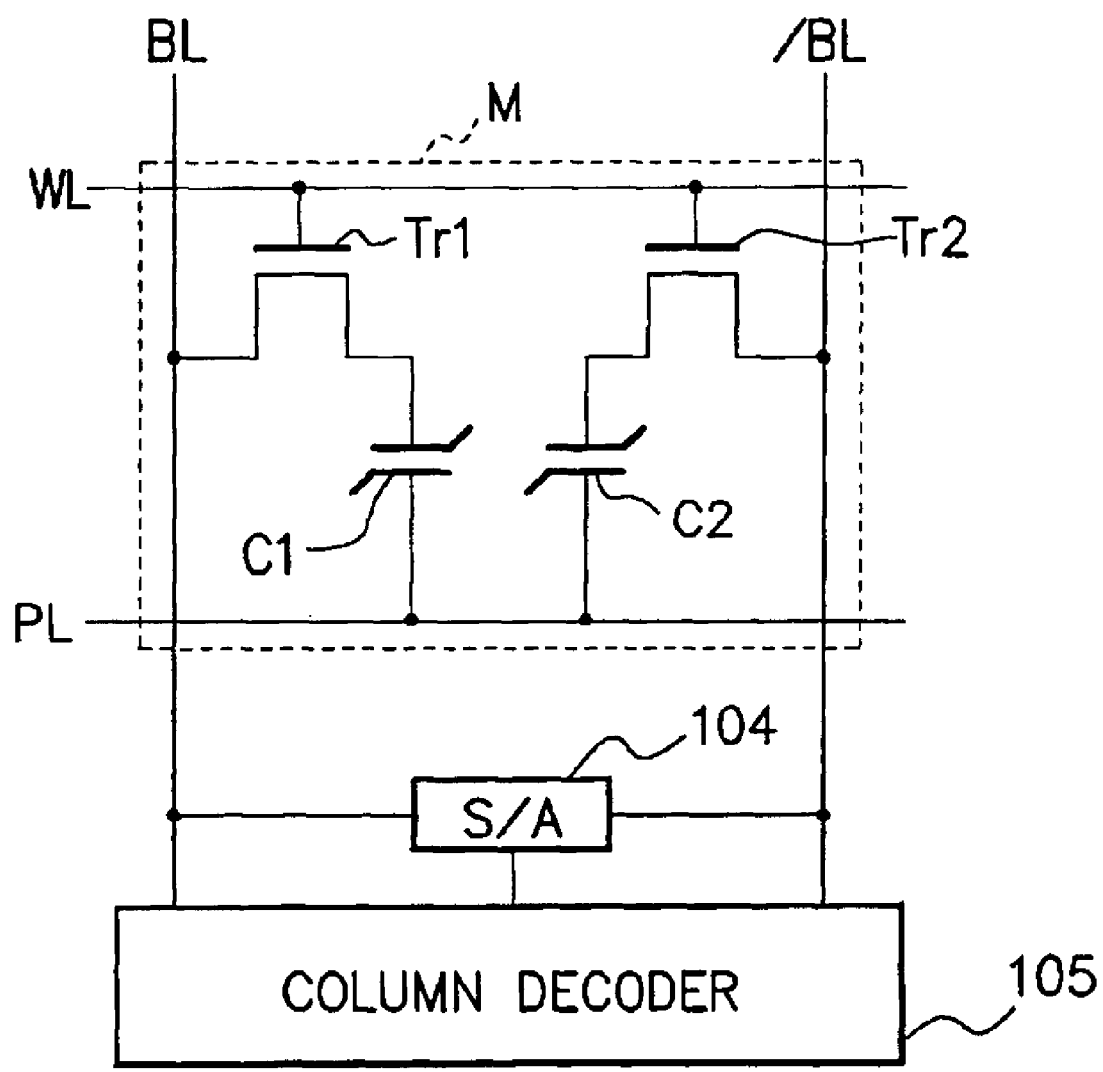
FIG. 10 is a view showing the schematic arrangement of a conventional memory cell formed from ferroelectric capacitors.

Referring to FIG. 1, a ferroelectric memory device 1 having a timing adjusting circuit has memory cells formed from ferroelectric capacitors (to be described below) and stores data in accordance with the direction of polarization of the ferroelectric capacitors. In a memory cell array 2, memory cells formed from ferroelectric capacitors are arranged in an array. A row decoder 3 selects a word line on the basis of externally input address data. In this embodiment, each memory cell included in the memory cell array 2 has the same arrangement as that of the memory cell M shown in FIG. 10, and a description thereof will be omitted (memory cells included in the memory cell array 2 will be referred to as memory cells M hereinafter). The memory cells M need not always have the arrangement described above and may have any other arrangement including a ferroelectric capacitor.

In accordance with data stored in the memory cells M, a sense amplifier circuit (S/A circuit) 4 amplifies the potential of bit lines selected by a column decoder 6 (to be described later). A timing adjusting circuit 5 adjusts the timing to activate the sense amplifier circuit 4. The column decoder 6 selects a bit line on the basis of externally input address data. The column decoder 6 also outputs an activation signal that activates the sense amplifier circuit 4. The activation signal is supplied to the activation signal input terminal of the sense amplifier circuit 4 through the timing adjusting circuit 5.

An input/output data processing circuit 7 latches or buffers input data to be stored in the memory cell array 2 or output data read out from the memory cell array 2, thereby inputting/outputting data from/to an external device through an input/output data bus. A control circuit 8 controls the operations of the above-described circuits on the basis of a control signal. With the above arrangement, the ferroelectric memory device 1 executes processing of writing/reading data in/from the memory cells M at portions designated by address data.

An example of the peripheral circuits of the above-described timing adjusting circuits 5 will be described next. FIG. 2 is a block diagram showing an example of peripheral circuits of the timing adjusting circuit 5 shown in FIG. 1. As shown in FIG. 2, the sense amplifier circuit 4 is connected to each pair of bit lines BL and /BL which connect the memory cells M and column decoder 6. Each activation signal output terminal of the column decoder 6 is connected to the activation signal input terminal of a corresponding one of the sense amplifier circuits 4 through the timing adjusting circuits 5 corresponding to the sense amplifier circuits 4 and outputs the activation signals that activates the sense amplifier circuits 4. That is, the ferroelectric memory device 1 has timing adjusting circuits 5 equal in number to the sense amplifier circuits 4.

A circuit example of the above-described timing adjusting circuit 5 will be described next.

Figure 3:
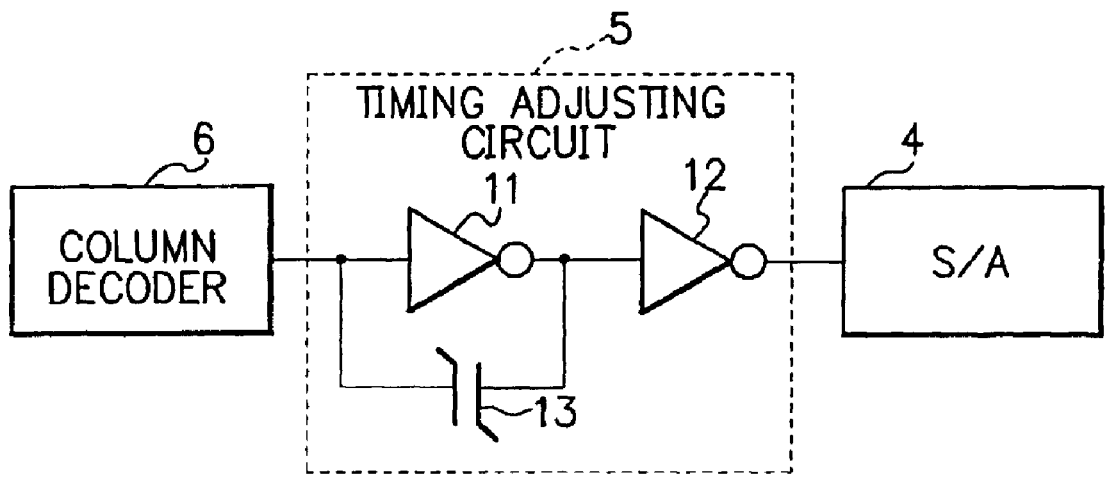
FIG. 3 is a view showing a circuit example of the timing adjusting circuit 5 shown in FIGS. 1 and 2.

FIG. 3 is a view showing a circuit example of the timing adjusting circuit 5 shown in FIGS. 1 and 2. As shown in FIG. 3, the timing adjusting circuit 5 comprises inverters 11 and 12 and a ferroelectric capacitor 13. The activation signal output terminal of the column decoder 6 is connected to the input terminal of the inverter 11 so that the inverter 11 receives the activation signal that is output from the column decoder 6 to activate the sense amplifier circuit 4. The output terminal of the inverter 11 is connected to the input terminal of the inverter 12 such that the activation signal inverted by the inverter 11 is inverted again to return to the initial polarity of the signal. The output terminal of the inverter 12 is connected to the activation signal input terminal of the sense amplifier circuit 4.

One terminal of the ferroelectric capacitor 13 is connected to the connection point between the activation signal output line of the column decoder 6 and the input terminal of the inverter 11. The other terminal of the ferroelectric capacitor 13 is connected to the connection point between the output terminal of the inverter 11 and the input terminal of the inverter 12. With the above arrangement, the timing adjusting circuit 5 receives a signal from the input terminal of the inverter 11, delays the signal in accordance with the capacitance of the ferroelectric capacitor 13, outputs the delayed signal from the output terminal of the inverter 11, and outputs, from the inverter 12, a signal obtained by inverting the output from the inverter 11.

Every time the activation signal changes to activate the sense amplifier circuit 4, the ferroelectric capacitor 13 repeats polarization reversal. More specifically, every time the sense amplifier circuit 4 is activated, and ferroelectric capacitors C1 and C2 of the memory cell M repeat polarization reversal, the ferroelectric capacitor 13 of the timing adjusting circuit 5 also repeats polarization reversal. For this reason, a degradation over time (an increase in capacitance of the ferroelectric capacitor) due to repetitive polarization reversal progresses almost at the same rate.

Figure 11:
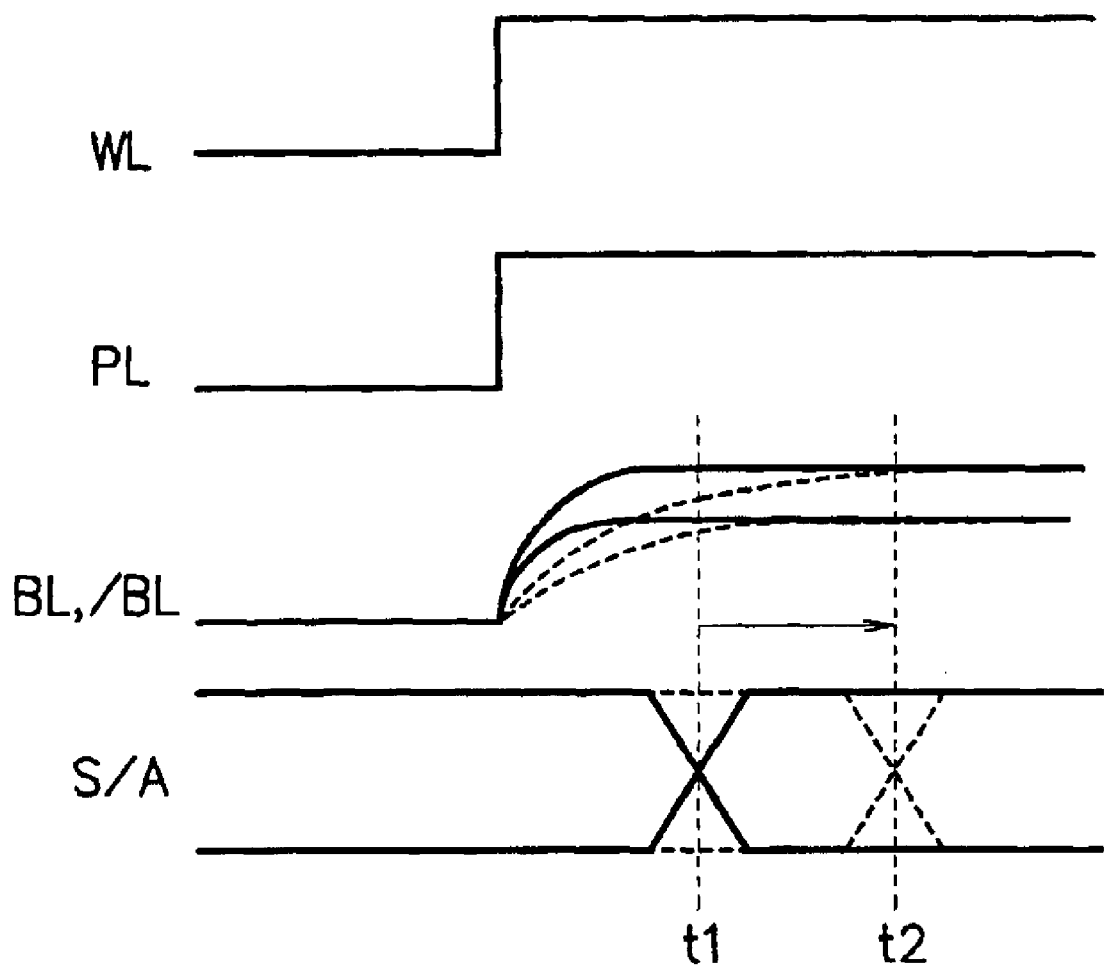
FIG. 11 is a timing chart showing the influence of an increase in capacitances of ferroelectric capacitors C1 and C2 due to a degradation over time in data read operation from a memory cell M shown in FIG. 10.

Accordingly, as shown in FIG. 11, when the capacitances of the ferroelectric capacitors C1 and C2 of the memory cell M increase due to repetitive polarization reversal, and the data output time to the bit lines BL and /BL becomes long, the ferroelectric capacitor 13 of the timing adjusting circuit 5 also repeats polarization reversal and increases its capacitance. Hence, the activation timing of the sense amplifier circuit 4 can be delayed in accordance with the change in ferroelectric capacitors C1 and C2 over time. That is, the activation timing of the sense amplifier circuit 4 can automatically be corrected from t1 to t2 shown in FIG. 11. Especially, as shown in FIG. 2, when a plurality of sense amplifier circuits 4 are present for the sets of bit lines BL and /BL, the timing can be adjusted for each sense amplifier circuit 4 in accordance with a degradation over time.

Even with an arrangement in which the potentials of all the bit lines that connect the memory cell array 2 and column decoder 6 should be amplified by one sense amplifier circuit 4, the timing can also be adjusted in accordance with the ferroelectric capacitors C1 and C2 of the memory cell M with a maximum degradation over time. Even at this time, the activation signal is supplied to the activation signal input terminal of the sense amplifier circuit 4 through the timing adjusting circuit 5.

Another example of the timing adjusting circuit 5 using a ferroelectric capacitor will be described next. The above-described timing adjusting circuit 5 delays the signal transmission time in accordance with the degradation in ferroelectric capacitor 13 over time. A timing advancing circuit which shortens the signal transmission time by using the degradation in ferroelectric capacitor over time will be described below. This timing advancing circuit can be installed at an arbitrary portion in the ferroelectric memory device shown in FIG. 1, where timing adjustment needs to be performed to shorten the transmission time in accordance with a degradation over time.

Figure 4:
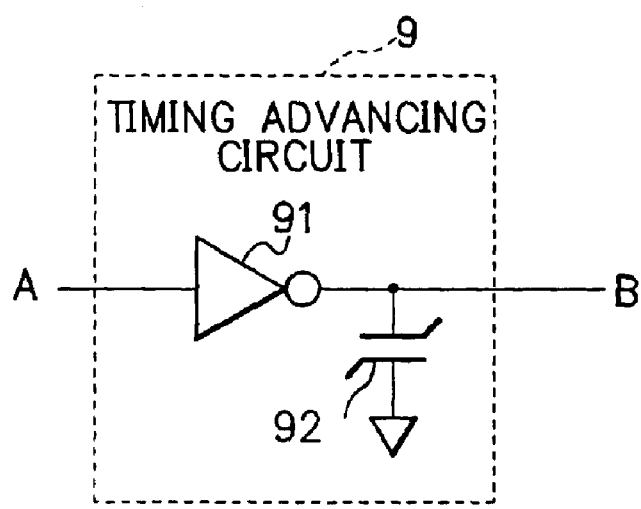
FIG. 4 is a view showing a circuit example of a timing advancing circuit according to an embodiment of the present invention.

FIG. 4 is a view showing a circuit example of a timing advancing circuit according to an embodiment of the present invention. As shown in FIG. 4, a timing advancing circuit 9 comprises an inverter 91 and ferroelectric capacitor 92. An input line A serving as a signal line that transmits a signal to be timing-adjusted is connected to the input terminal of the inverter 91. The output terminal of the inverter 91 is connected to an output line B. The connection point between the output line B and the output terminal of the inverter 91 is connected to ground through the ferroelectric capacitor 92.

With the above arrangement, one terminal of the ferroelectric capacitor 92 is connected to the output terminal of the inverter 91. A voltage of low level (L level) or high level (H level) output from the inverter 91 is applied to the terminal of the ferroelectric capacitor 92. The other terminal of the ferroelectric capacitor 92 is connected to ground so that 0 V is applied to the terminal. For this reason, no polarization reversal takes place in the ferroelectric capacitor 92.

Figure 5A:
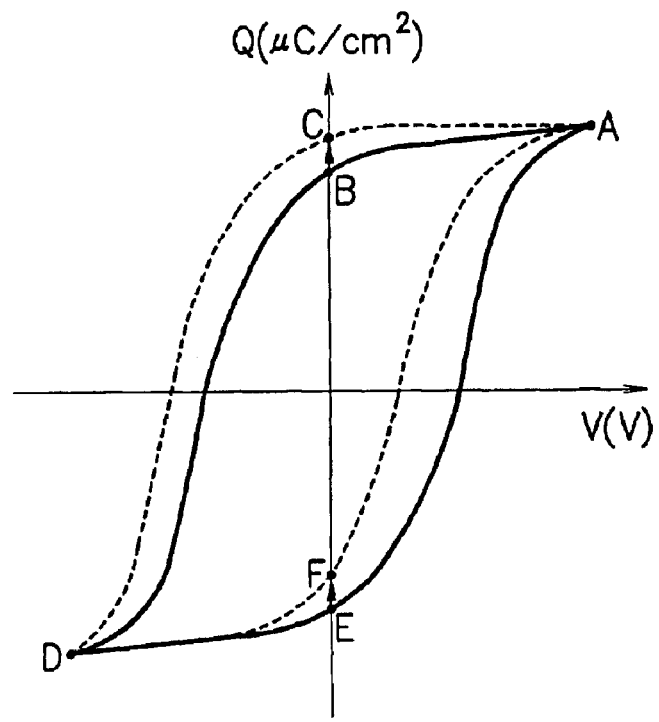
FIGS. 5A and 5B are graphs for explaining a degradation over time when a voltage applied to one terminal of a ferroelectric capacitor changes though no polarization reversal occurs.
Figure 5B:
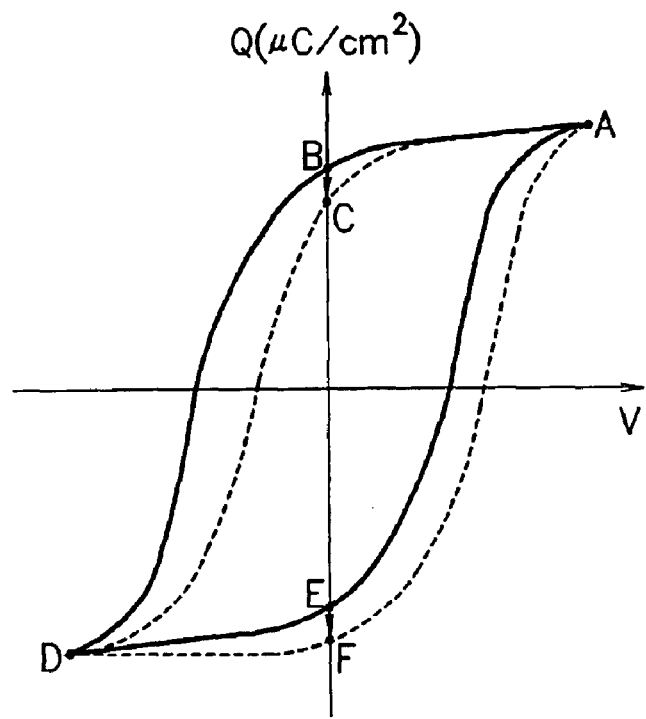

A degradation in ferroelectric capacitor 92 over time in this case will be described. FIGS. 5A and 5B are graphs for explaining a degradation over time when the voltage applied to one terminal of the ferroelectric capacitor changes though no polarization reversal occurs. As shown in FIG. 5A, when the voltage applied to one terminal of the ferroelectric capacitor 92 changes, transition operation between points A and B on the hysteresis curve indicated by the solid line is repeated. When this operation is repeated, the characteristic transition takes place from the point B to a point C due to a degradation over time, and the capacitance of the ferroelectric capacitor 92 decreases, i.e., imprint degradation occurs. That is, the signal transmission speed of the timing advancing circuit 9 becomes high.

In this embodiment, the region between the points A and B and the region between points D and E shown in FIGS. 5A and 5B are defined as linear regions without any polarization reversal. More specifically, as the activation signal changes, the state of the ferroelectric capacitor 92 repeatedly moves in the linear region on the hysteresis curve. The signal from the timing advancing circuit 9 is inverted because it has only one inverter 91. To prevent signal inversion, another inverter may be arranged on the input or output side of the timing advancing circuit 9. Alternatively, the inverter 91 may be replaced with a buffer. The above-described region between the points D and E shown in FIG. 5B will be described later.

As described above, the timing advancing circuit 9 can be used at a portion where the timing needs to be advanced. In the ferroelectric memory device 1 shown in FIG. 1, for example, the timing advancing circuit 9 is inserted to a control signal line which transmits a control signal output from the control circuit 8 to control the timing to read out a signal from the memory cell to the bit lines BL and /BL. With this arrangement, the timing to read out the signal from the memory cell M can be advanced in accordance with a degradation over time in ferroelectric capacitors C1 and C2 included in the memory cell M.

Figure 6A:
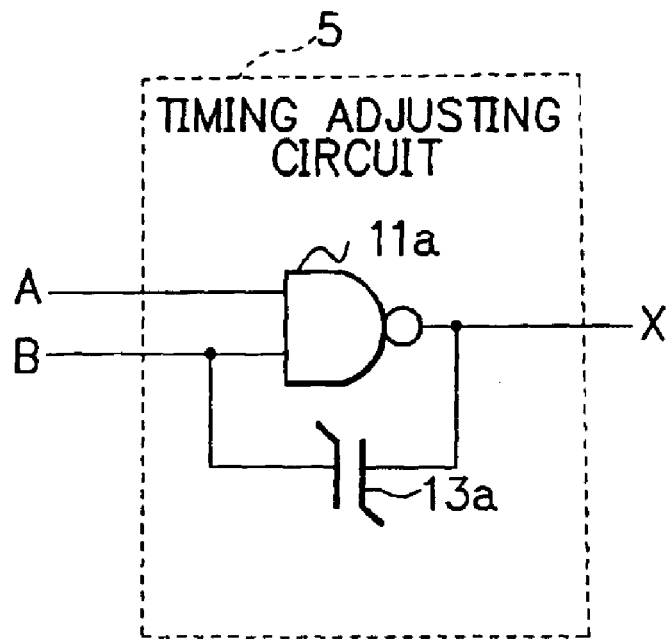
FIGS. 6A and 6B are views showing other circuit examples of the timing adjusting circuit 5 according to the embodiment of the present invention.

A circuit example of the timing adjusting circuit 5 shown in FIGS. 1 and 2, which has an arrangement different from that shown in FIG. 3, will be described next. FIG. 6A is a view showing another circuit example 1 of the timing adjusting circuit 5. The timing adjusting circuit 5 shown in FIG. 6A has a NAND (negative logical product) circuit 11a and ferroelectric capacitor 13a. A signal line B that transmits a signal to be timing-adjusted is connected to one input terminal of the NAND circuit 11a. A signal line A that transmits a control signal to control whether the timing adjusting circuit 5 should be activated is connected to the other input terminal of the NAND circuit 11a. The output terminal of the NAND circuit 11a is connected to an output line X of the timing adjusting circuit 5.

One terminal of the ferroelectric capacitor 13a is connected to the connection point between the signal line B and the other input terminal of the NAND circuit 11a. The other terminal of the ferroelectric capacitor 13a is connected to the connection point between the output line X and the output terminal of the NAND circuit 11a. That is, one input terminal and the output terminal of the NAND circuit 11a are connected in parallel to the ferroelectric capacitor 13a. The control signal to control polarization reversal of the ferroelectric capacitor 13a (control whether the timing adjusting circuit 5 should be activated) is input to the other input terminal of the NAND circuit 11a.

With the above arrangement, when a signal of low level is input to the signal line A as a control signal, the timing adjusting circuit 5 shown in FIG. 6A normally outputs high level. When a signal of high level is input to the signal line A as a control signal, the timing adjusting circuit 5 is activated and outputs a signal obtained by inverting the input signal and delaying it in accordance with the capacitance of the ferroelectric capacitor 13a. That is, the arrangement is equivalent to that of the timing adjusting circuit 5 shown in FIG. 3 without the inverter 12.

Figure 6B:
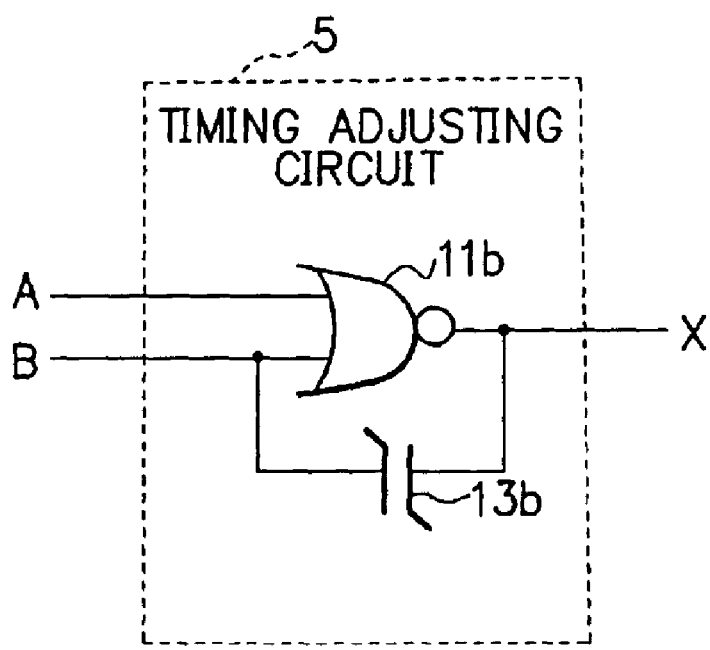

FIG. 6B is a view showing still another circuit example 2 of the timing adjusting circuit 5. The timing adjusting circuit 5 shown in FIG. 6B has a NOR (negative logical sum) circuit 11b and ferroelectric capacitor 13b. The signal line B that transmits a signal to be timing-adjusted is connected to one input terminal of the NOR circuit 11b. The signal line A that transmits a control signal to control whether the timing adjusting circuit 5 should be activated is connected to the other input terminal of the NOR circuit 11b. The output terminal of the NOR circuit 11b is connected to the output line X of the timing adjusting circuit 5.

One terminal of the ferroelectric capacitor 13b is connected to the connection point between the signal line B and the other input terminal of the NOR circuit 11b. The other terminal of the ferroelectric capacitor 13b is connected to the connection point between the output line X and the output terminal of the NOR circuit 11b. That is, one input terminal and the output terminal of the NOR circuit 11b are connected in parallel to the ferroelectric capacitor 13b. The control signal to control polarization reversal of the ferroelectric capacitor 13b (control whether the timing adjusting circuit 5 should be activated) is input to the other input terminal of the NOR circuit 11b.

With the above arrangement, when a signal of high level is input to the signal line A as a control signal, the timing adjusting circuit 5 shown in FIG. 6B normally outputs low level. When a signal of low level is input to the signal line A as a control signal, the timing adjusting circuit 5 is activated and outputs a signal obtained by inverting the input signal and delaying it in accordance with the capacitance of the ferroelectric capacitor 13b. That is, the arrangement is equivalent to that of the timing adjusting circuit 5 shown in FIG. 3 without the inverter 12.

In the timing adjusting circuits 5 shown in FIGS. 6A and 6B, the output signal is an inverted signal of the input signal. To prevent inversion, an inverter is arranged on the input or output side of the timing adjusting circuit 5.

Figure 7A:
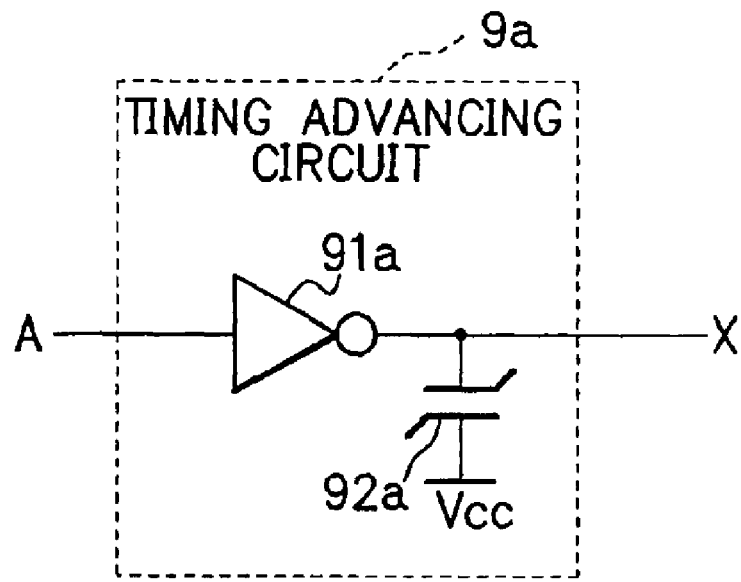
FIGS. 7A and 7B are views showing other circuit examples having the same function as that of the timing advancing circuit 9 according to the embodiment of the present invention.

A circuit example which has the same function as that of the timing advancing circuit 9 shown in FIG. 4 but a different circuit arrangement will be described next. FIG. 7A is a view showing circuit example 1 having the same function as that of the timing advancing circuit 9. A timing advancing circuit 9a shown in FIG. 7A has an inverter 91a and ferroelectric capacitor 92a. The input line A serving as a signal line that transmits a signal to be timing-adjusted is connected to the input terminal of the inverter 91a. The output terminal of the inverter 91a is connected to the output line B. The connection point between the output line B and the output terminal of the inverter 91a is connected, through the ferroelectric capacitor 92a, to a power supply line that supplies a power supply voltage Vcc.

With the above arrangement, one terminal of the ferroelectric capacitor 92a is connected to the output terminal of the inverter 91a so that a voltage of low or high level output from the inverter 91a is applied to the terminal. The power supply voltage Vcc is supplied to the other terminal of the ferroelectric capacitor 92a. For this reason, no polarization reversal occurs in the ferroelectric capacitor 92a. A degradation in ferroelectric capacitor 92a over time in this case will be described. As shown in FIG. 5B described above, when the voltage applied to one terminal of the ferroelectric capacitor 92a changes, transition operation between the points D and E on the hysteresis curve indicated by the solid line is repeated. When this operation is repeated, the characteristic transition takes place from the point E to a point F due to a degradation over time, and the capacitance of the ferroelectric capacitor 92a decreases, i.e., imprint degradation occurs. That is, the signal transmission speed of the timing advancing circuit 9a becomes high.

Figure 7B:
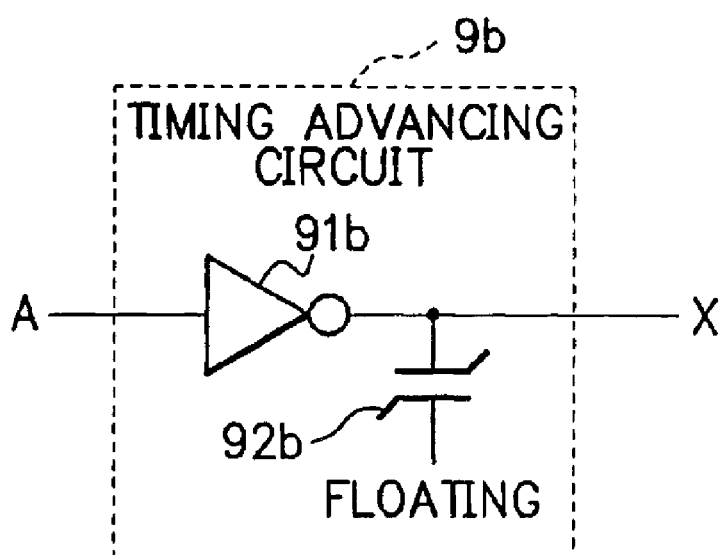
Figure 8:
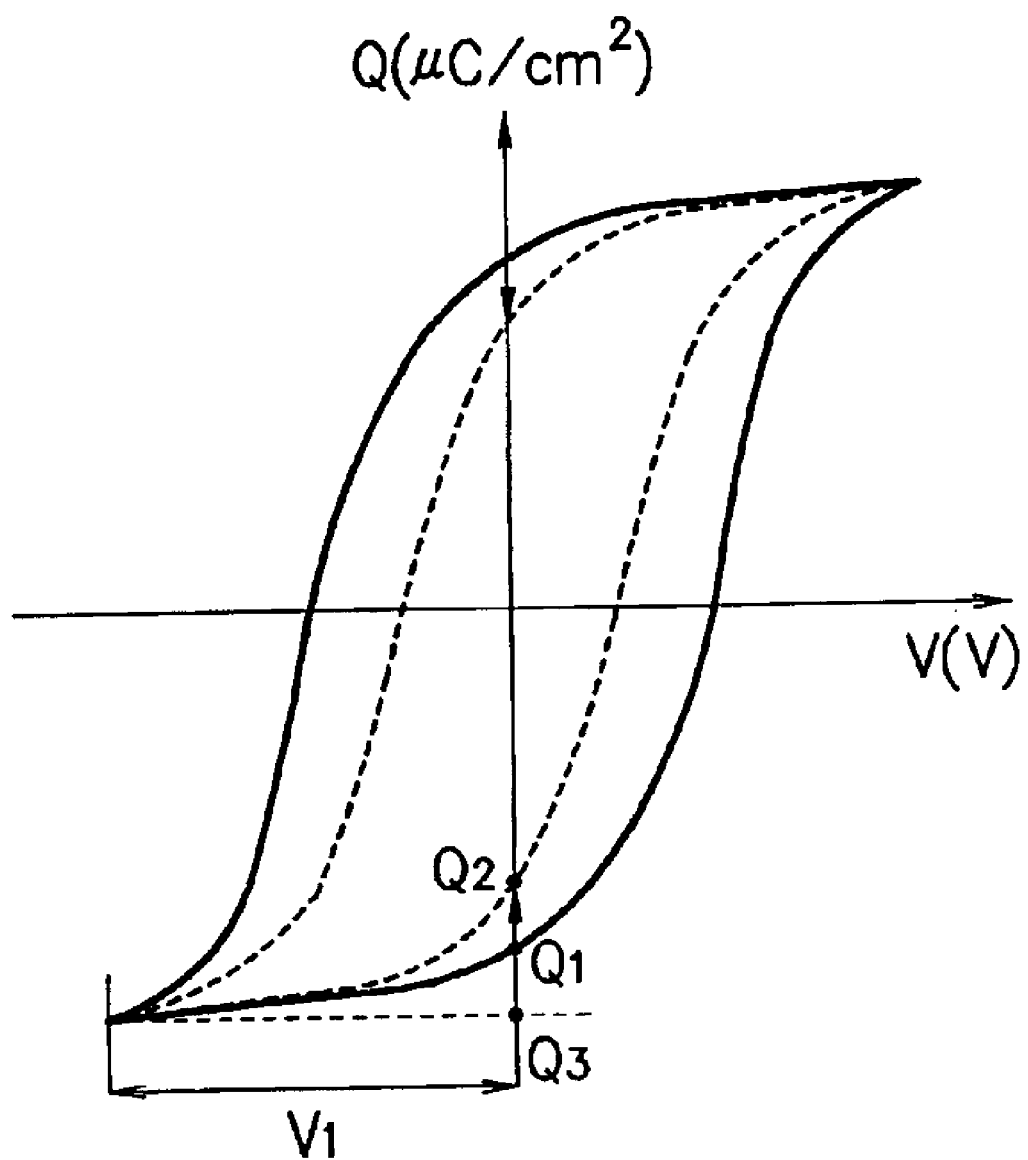
FIG. 8 is a graph showing the hysteresis characteristic indicating depolarization of a ferroelectric capacitor.
Figure 9:
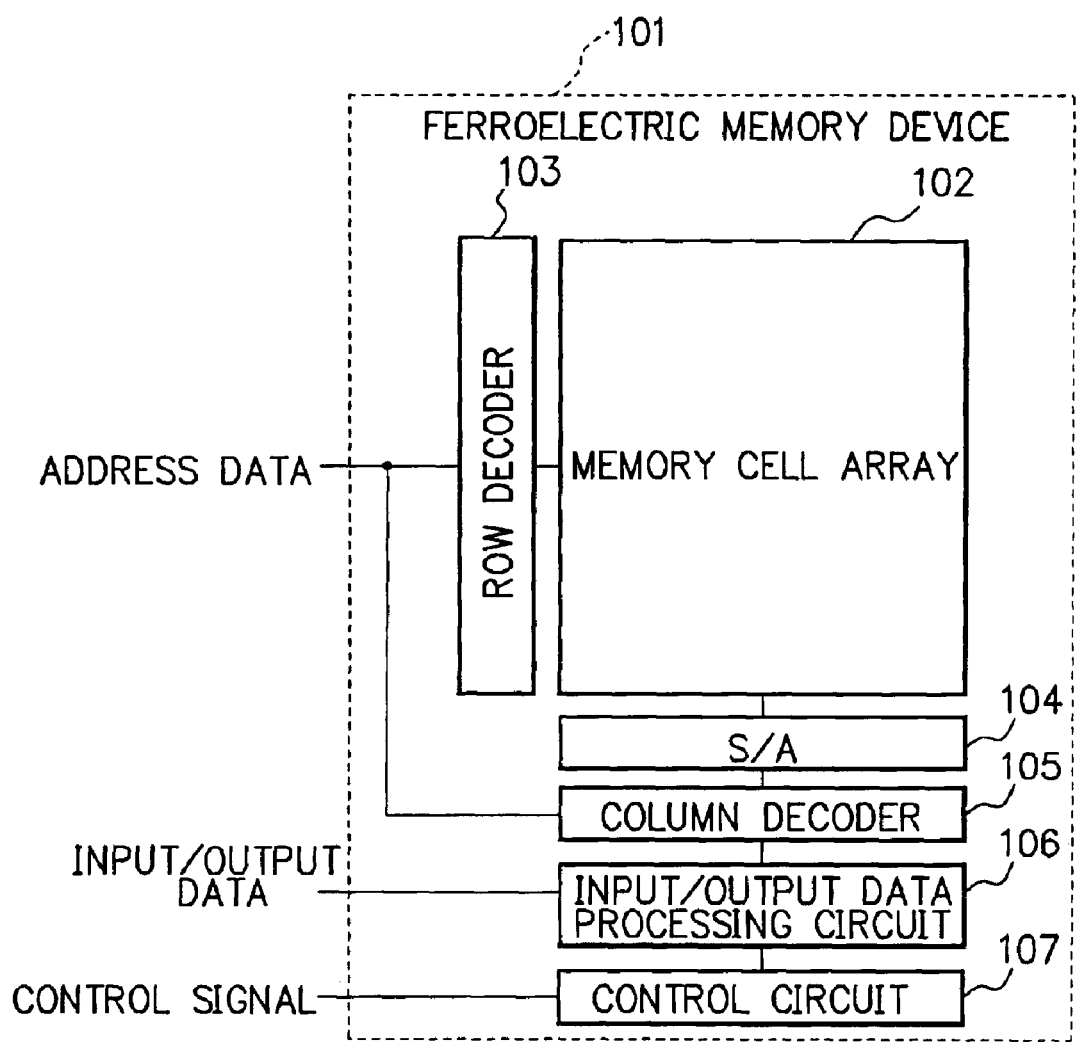
FIG. 9 is a block diagram showing the schematic arrangement of a conventional ferroelectric memory device.

FIG. 7B is a view showing another circuit example 2 which has the same function as that of the timing advancing circuit 9. A timing advancing circuit 9b shown in FIG. 7B has an inverter 91b and ferroelectric capacitor 92b. The input line A is connected to the input terminal of the inverter 91b. The output terminal of the inverter 91b is connected to the output line B. The connection point between the output line B and the output terminal of the inverter 91b is connected to one terminal of the ferroelectric capacitor 92b. The other terminal of the ferroelectric capacitor 92b is connected to nothing and set in a floating state.

With the above arrangement, one terminal of the ferroelectric capacitor 92b is connected to the output terminal of the inverter 91b so that a voltage of low or high level output from the inverter 91b is applied to the terminal. For this reason, no polarization reversal occurs in the ferroelectric capacitor 92b. A degradation in ferroelectric capacitor 92b over time in this case will be described. Referring to FIG. 5A described above, when the voltage applied to one terminal of the ferroelectric capacitor 92b changes, vertical transition operation along the solid line centered on the point B on the hysteresis curve indicated by the solid line is repeated. When this operation is repeated, the characteristic transition takes place from the point B to the point C due to a degradation over time, and the capacitance of the ferroelectric capacitor 92b decreases, i.e., imprint degradation occurs. That is, the signal transmission speed of the timing advancing circuit 9b becomes high.

As a characteristic feature of the timing advancing circuit 9b, it can more moderately advance the timing because the imprint degradation progresses slowly as compared to the timing advancing circuit 9 or 9a because the capacitance changes centered on the point B shown in FIG. 5A. The signal from the timing advancing circuit 9a or 9b is inverted because it has only one inverter 91a or 91b. To prevent signal inversion, another inverter may be arranged on the input or output side of the timing advancing circuit 9a or 9b.

In the above-described embodiment, a timing adjusting circuit is used for a ferroelectric memory device. However, the present invention is not limited to this. If the signal transmission speed needs to be made high or low in accordance with a degradation in various circuit elements over time, the above-described timing adjusting circuit can suitably be used. The above-described timing adjusting circuit can also suitably be used to advance or delay the reaction timing in processing of an electronic device in accordance with the number of times of use of the electronic device. The timing adjusting circuit according to this embodiment is inserted to a signal line that transmits a signal to be timing-adjusted and adjusts a timing.

The embodiment of the present invention has been described above in detail with reference to the accompanying drawings. However, a detailed arrangement is not limited to the embodiment, and a design without departing from the spirit and scope of the invention is also incorporated in the invention.

As has been described above, the timing adjusting circuit according to the present invention has a ferroelectric capacitor for timing adjustment in transmitting a signal. Hence, the timing can be adjusted in accordance with the elapse of time by using a change in capacitance over time, which is unique to the ferroelectric capacitor.

Accordingly, a timing adjusting circuit capable of adjusting timing in accordance with a change in circuit element over time can be provided.

Additionally, the semiconductor memory device according to the present invention comprises a plurality of memory cells having ferroelectric capacitors, a sense amplifier circuit which amplifies the potential of a bit line of each memory cell, and a timing adjusting circuit which uses a ferroelectric capacitor for timing adjustment in transmitting an activation signal to activate the sense amplifier circuit. Hence, the timing of the activation signal that activates the sense amplifier circuit can be adjusted in accordance with a change in ferroelectric capacitor of the memory cell over time.

Especially, when a plurality of memory cells have a plurality of bit lines, a plurality of sense amplifier circuits are arranged for each bit line pair, and a timing adjusting circuit is also arranged for each sense amplifier circuit, the timing of the activation signal can be adjusted for each sense amplifier circuit connected to a bit line in accordance with the use frequency (data write/read frequency) of the memory cell connected to the bit line.

What is claimed is:

1. A timing adjusting circuit, comprising a ferroelectric capacitor for timing adjustment in transmitting a signal, wherein said ferroelectric capacitor repeats polarization reversal in accordance with a change in the signal.

2. The circuit according to claim 1, further comprising an inverter connected in parallel to said ferroelectric capacitor to repeat the polarization reversal in accordance with the change in the signal.

3. The circuit according to claim 1, wherein the circuit further comprises a NAND circuit comprising:
   a first input terminal;
   a second input terminal; and
   an output terminal, wherein the first input terminal of said NAND circuit and the output terminal of said NAND circuit are connected in parallel to said ferroelectric capacitor, and wherein a signal line that transmits a control signal to control the polarization reversal of said ferroelectric capacitor is connected to the second input terminal of said NAND circuit.

4. The circuit according to claim 1, wherein the circuit further comprises a NOR circuit comprising:
   a first input terminal;
   a second input terminal; and
   an output terminal, wherein the first input terminal of said NOR circuit and the output terminal of said NOR circuit are connected in parallel to said ferroelectric capacitor, and wherein a signal line that transmits a control signal to control the polarization reversal of said ferroelectric capacitor is connected to the second input terminal of said NOR circuit.

5. A timing adjusting circuit, comprising a ferroelectric capacitor for timing adjustment in transmitting a signal, wherein said ferroelectric capacitor repeats movement only in a linear region on a hysteresis curve in accordance with the change in the signal.

6. A timing advancing circuit, comprising:
   a ferroelectric capacitor for timing advancement in transmitting a signal, wherein said ferroelectric capacitor comprises a first terminal and a second terminal; and
   an inverter having an output terminal connected to the first terminal of said ferroelectric capacitor and an input terminal connected to a signal line that transmits the signal, wherein the second terminal of said ferroelectric capacitor is constantly connected to ground.

7. A timing advancing circuit, comprising:
   a ferroelectric capacitor for timing advancement in transmitting a signal, wherein the ferroelectric capacitor comprises a first terminal and a second terminal; and
   an inverter having an output terminal connected to the first terminal of said ferroelectric capacitor and an input terminal connected to a signal line that transmits the signal, wherein the second terminal of said ferroelectric capacitor is connected to a power supply line.

8. A timing advancing circuit, comprising:
   a ferroelectric capacitor for timing advancement in transmitting a signal, wherein said ferroelectric capacitor comprises a first terminal and a second terminal; and
   an inverter having an output terminal connected to the first terminal of said ferroelectric capacitor and an input terminal connected to a signal line that transmits the signal, wherein the second terminal of said ferroelectric capacitor is constantly set in a floating state.

9. A semiconductor memory device, comprising:
   a plurality of memory cells having ferroelectric capacitors;
   a plurality of sense amplifier circuits which amplify a potential of bit lines of said memory cells; and
   a timing adjusting circuit which uses a ferroelectric capacitor for timing adjustment in transmitting an activation signal to activate said sense amplifier circuits, wherein said ferroelectric capacitor of said timing adjusting circuit repeats polarization reversal in accordance with a change in the activation signal.

10. The device according to claim 9, wherein
   said plurality of memory cells have a plurality of bit lines,
   said sense amplifier circuits are arranged for each bit line pair, and
   said timing adjusting circuit is arranged for each said sense amplifier circuits.

11. The device according to claim 10, wherein said timing adjusting circuit further comprises an inverter connected in parallel to said ferroelectric capacitor.

12. The device according to claim 9, wherein said timing adjusting circuit further comprises an inverter connected in parallel to said ferroelectric capacitor.

13. The device according to claim 9, wherein said timing adjusting circuit further comprises a NAND circuit comprising a first input terminal, a second input terminal, and an output terminal, wherein the first input terminal of said NAND circuit and the output terminal of said NAND circuit are connected in parallel to said ferroelectric capacitor, and wherein a signal line that transmits a control signal to control the polarization reversal of said ferroelectric capacitor is connected to the second input terminal of said NAND circuit.

14. The device according to claim 10, wherein said timing adjusting circuit further comprises a NAND circuit comprising a first input terminal, a second input terminal, and an output terminal, wherein the first input terminal of the NAND circuit and the output terminal of the NAND circuit are connected in parallel to said ferroelectric capacitor, and wherein a signal line that transmits a control signal to control the polarization reversal of said ferroelectric capacitor is connected to the second input terminal of said NAND circuit.

15. The device according to claim 9, wherein said timing adjusting circuit further comprises a NOR circuit comprising a first input terminal, a second input terminal, and an output terminal, wherein the first input terminal of the NOR circuit and the output terminal of the NOR circuit are connected in parallel to said ferroelectric capacitor, and wherein a signal line that transmits a control signal to control the polarization reversal of said ferroelectric capacitor is connected to the second input terminal of said NOR circuit.

16. The device according to claim 10, wherein said timing adjusting circuit further comprises a NOR circuit comprising a first input terminal, a second input terminal, and an output terminal, wherein the first input terminal of the NOR circuit and the output terminal of the NOR circuit are connected in parallel to said ferroelectric capacitor, and wherein a signal line that transmits a control signal to control the polarization reversal of said ferroelectric capacitor is connected to the input terminal of said NOR circuit.

17. A timing adjusting circuit, comprising:
  a ferroelectric capacitor for timing adjustment in transmitting a signal; and
  a polarization reversal circuit connected in parallel to said ferroelectric capacitor to repeat polarization reversal in accordance with a change in the signal.

18. The circuit according to claim 17, wherein said polarization reversal circuit is an inverter.

19. The circuit according to claim 17, wherein said polarization reversal circuit is a NAND circuit.

20. The circuit according to claim 17, wherein said polarization reversal circuit is a NOR circuit.

* * * * *